(12) United States Patent
Forsyth

(10) Patent No.: US 7,431,162 B2
(45) Date of Patent: Oct. 7, 2008

(54) SHOCK ABSORBING HORIZONTAL TRANSPORT WAFER BOX

(75) Inventor: Valoris L. Forsyth, Lewisville, TX (US)

(73) Assignee: Illinois Tool Works Inc., Glenview, IL (US)

( * ) Notice: Subject to any disclaimer, the term of this patent is extended or adjusted under 35 U.S.C. 154(b) by 620 days.

(21) Appl. No.: 11/182,438

(22) Filed: Jul. 15, 2005

(65) Prior Publication Data

US 2007/0012594 A1      Jan. 18, 2007

(51) Int. Cl.
*B65D 85/30* (2006.01)
(52) U.S. Cl. ..................................................... 206/710
(58) Field of Classification Search ......... 206/710–712, 206/832, 454, 445, 449, 453, 455, 456, 493; 220/8, 324, 326; 211/41.12, 41.18; 312/9.9, 312/9.64, 9.2, 9.8
See application file for complete search history.

(56) References Cited

U.S. PATENT DOCUMENTS

| | | | | |
|---|---|---|---|---|
| 5,553,711 A | * | 9/1996 | Lin et al. ..................... | 206/710 |
| 5,725,100 A | * | 3/1998 | Yamada ....................... | 206/710 |
| 6,193,068 B1 | * | 2/2001 | Lewis et al. .................. | 206/710 |
| 6,193,090 B1 | * | 2/2001 | Connors et al. ............. | 220/4.24 |
| 6,237,771 B1 | * | 5/2001 | Haq ............................ | 206/454 |
| 6,550,619 B2 | * | 4/2003 | Bores et al. .................. | 206/710 |
| 6,988,621 B2 | * | 1/2006 | Forsyth ....................... | 206/710 |
| 2003/0010657 A1 | * | 1/2003 | Zabka et al. ................. | 206/303 |

* cited by examiner

*Primary Examiner*—Mickey Yu
*Assistant Examiner*—Steven A. Reynolds
(74) *Attorney, Agent, or Firm*—Day Pitney LLP

(57) ABSTRACT

The present disclosure pertains to a wafer box for transporting semiconductor wafers, typically in a coin stack configuration. The wafer box includes an outer box and at least one inner box. The semiconductor wafers are placed in the inner box or boxes, typically with appropriate separators and interleaves. The outer box includes a tray portion and a lid portion. The tray portion includes posts rising from its floor which are received by sleeves in the inner box. Shock absorbing rings are placed on the posts both above and below the inner box or boxes in order to provide protection against vertical shocks. Moreover, the outer box includes radially pivoting latching elements with padded bumper elements. These padded bumper elements are brought to an upright position to urge against the inner box or boxes in order to provide horizontal or lateral shock protection.

9 Claims, 4 Drawing Sheets

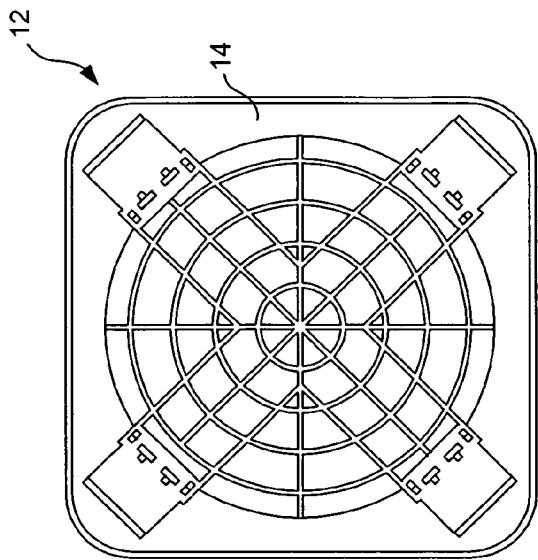
FIG. 4
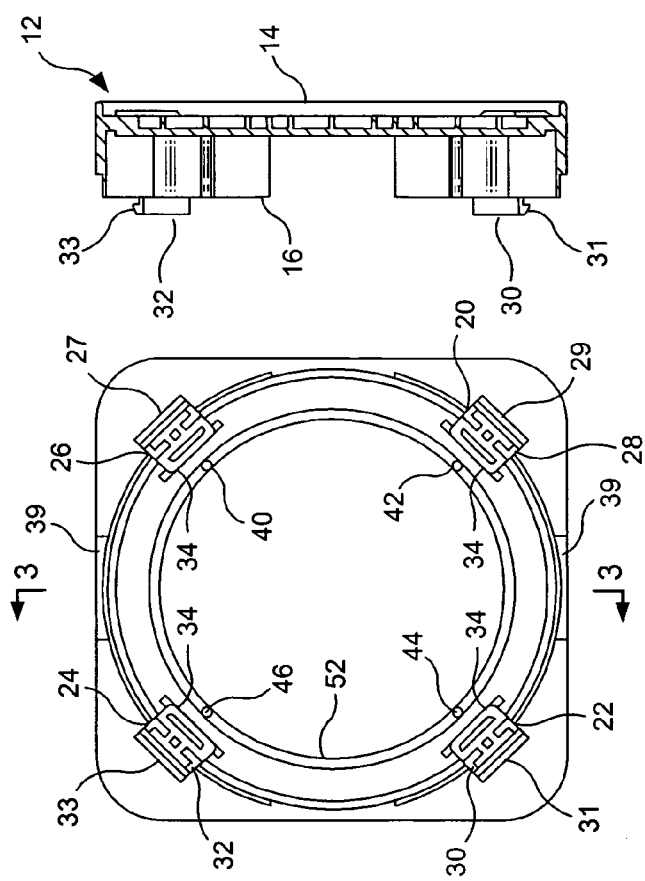
FIG. 3
FIG. 1
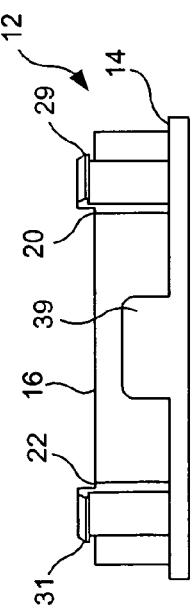
FIG. 2

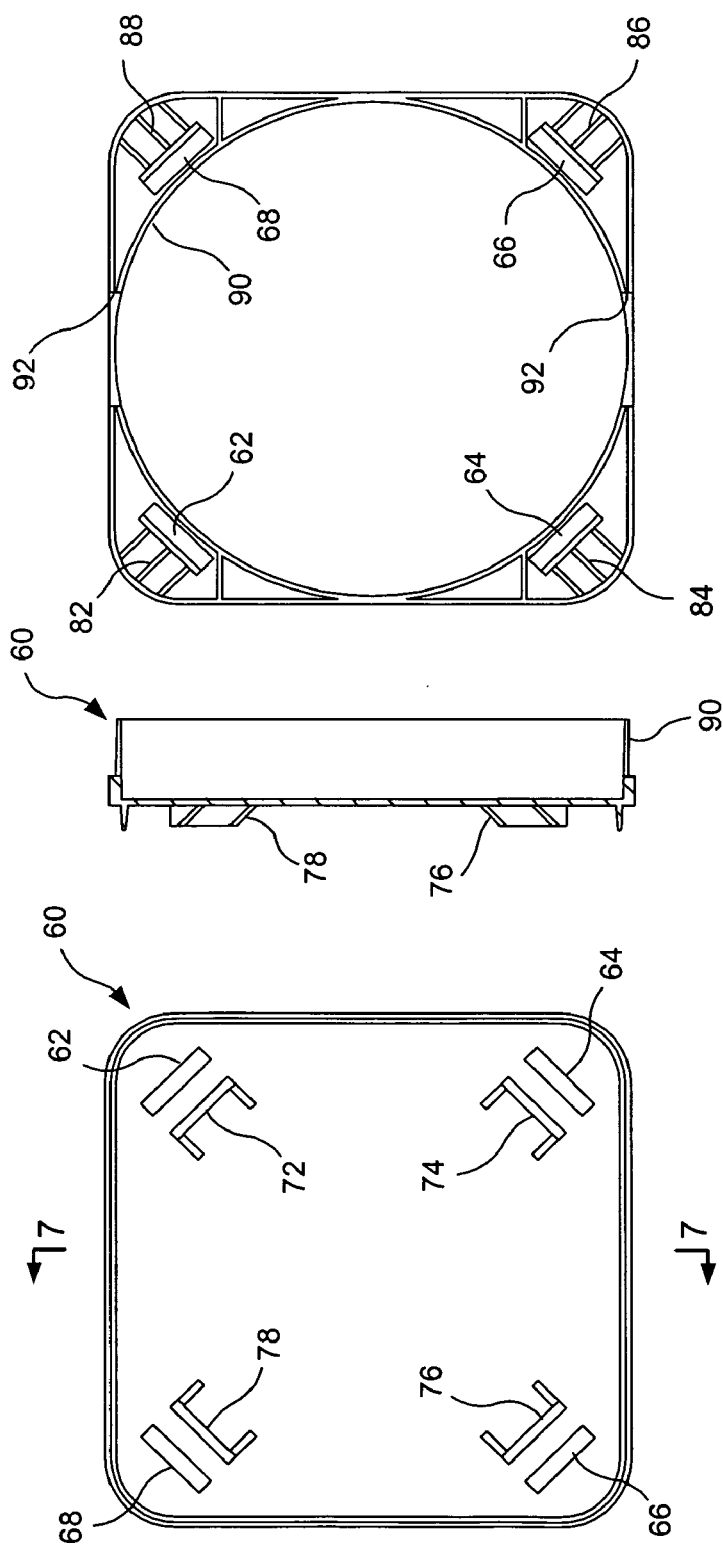

SHOCK ABSORBING HORIZONTAL TRANSPORT WAFER BOX

BACKGROUND OF THE INVENTION

1. Field of the Invention

The present invention pertains to a box for transporting semiconductor wafers. More particularly, the present invention pertains to such a box which transports the wafers in a horizontal position with shock absorbing capability in both horizontal and vertical directions.

2. Description of the Prior Art

Horizontal transport boxes for semiconductor wafers are known in the prior art. Such horizontal transport boxes are disclosed by U.S. Pat. No. 6,341,695 entitled "Containment Device for Retaining Semiconductor Wafers", issued on Jan. 29, 2002 to Lewis. This design, while satisfactory in many respects for its intended purposes, does not include substantial shock absorbing capability. Extruded fin pins, for horizontal shock absorbing capability, have been proposed by U.S. patent application Ser. No. 10/787,489 entitled "Reduced Movement Wafer Box" filed on Feb. 25, 2004 by Forsyth. Again, this design is satisfactory in many respects. A similar design with radially pivoting latched bumpers in lieu of separate fin pins is disclosed in U.S. patent application Ser. No. 10/507,471 entitled "Wafer Box with Radially Pivoting Latch Elements" filed on Sep. 10, 2004 by Forsyth et al., wherein the latched bumpers act to contain a coin stack of wafers and protect the stack from lateral shock. Typically, foam or some similar absorbing agent is used within the top and bottom of the box to absorb vertically directed shocks. This design has been satisfactory for its intended purposes, particularly when used with semiconductor wafers with raised features on the wafer surface such as balls, caps, lenses, and optical components. However, further improvements are sought in the transportation of very thin wafers which typically have no protruding surface features and are extremely fragile.

In particular, there is a need for improvements in the transportation of stacked Fine Pitched Ball Grid Arrays (FBGA) and similar stacked chip sets. These types of assembly packaging configurations have semiconductor wafer thicknesses which approach the thickness of a sheet of paper. When shipped using prior art wafer boxes, a high percentage of these semiconductor wafers are damaged. Moreover, such wafers typically have a sharp edge profile tape that results in edge cracking and chipping, particularly if there are irregular features such as a corner edge. Such cracks or chips on the edge can migrates into the wafer core during transportation.

Additionally, there is a need for improvements in the transportation of different thicknesses and types of semiconductor wafers within a single package. For instance, it is advantageous in some circumstances to ship DRAM wafers, microprocessor wafers and DA converter wafers, thereby providing a "kit", within a single package.

OBJECTS AND SUMMARY OF THE INVENTION

It is therefore an object of the present invention to provide a wafer box for the transportation of semiconductor wafers which provides a shock absorbing function in all directions.

It is therefore a further object of the present invention to provide a wafer box which provides sufficient protection for the transportation of very thin semiconductor wafers, such as fine pitched ball grid array semiconductor wafers.

It is therefore a still further object of the present invention to allow wafers of different thicknesses and types to be shipped within a single package.

It is therefore a still further object of the present invention to achieve the above objects while transporting the semiconductor wafers in a coin stack configuration.

These and objects are attained by providing a wafer box which includes an outer box, at least one inner box, and upper and lower shock absorber elements. The inner box includes a reservoir with tightly controlled dimensions into which semiconductor wafers are loaded, perhaps by hand, and typically alternated with interleaving material with impact absorbing sheet foam or corrugated spacers added at the ends of the coin stack The outer box includes at least four interior posts which are inserted through sleeves which are integral with the inner box. Similarly, upper and lower shock absorbers include sleeves which are engaged by the posts of the outer box whereby the upper shock absorber is positioned between the top of the inner box and the lid of the outer box and the lower shock absorber is position between the bottom of the inner box and the floor of the outer box.

Multiple inner boxes can be coin stacked, particularly if wafers of different thicknesses and types are desired to be shipped within a single package.

Moreover, the outer box includes a lid and radially pivoting latch elements with interior bumpers, similar to the above-cited U.S. patent application Ser. No. 10/507,471, whereby the latch elements are drawn to their upright positions and latched by the lid so that the interior bumpers impinge against the inner box.

DESCRIPTION OF THE DRAWINGS

Further objects and advantages of the invention will become apparent from the following description and claims, and from the accompanying drawings:

FIG. 1 is a top plan view of the tray portion of the outer box of the wafer containment box of the present invention.

FIG. 2 is a side plan view of the tray portion of the outer box of the wafer containment box of the present invention.

FIG. 3 is a cross-sectional view along plane 3-3 of FIG. 1.

FIG. 4 is a bottom plan view of the tray portion of the outer box of the wafer containment box of the present invention.

FIG. 6 is a top plan view of the lid portion of the outer box of the wafer containment box of the present invention.

FIG. 7 is a cross-sectional view along plane 7-7 of FIG. 6.

FIG. 8 is a bottom plan view of the lid portion of the outer box of the wafer containment box of the present invention.

FIG. 9 is a side view of the lid portion of the outer box of the wafer containment box of the present invention.

DETAILED DESCRIPTION OF THE PREFERRED EMBODIMENT

Figure 5:
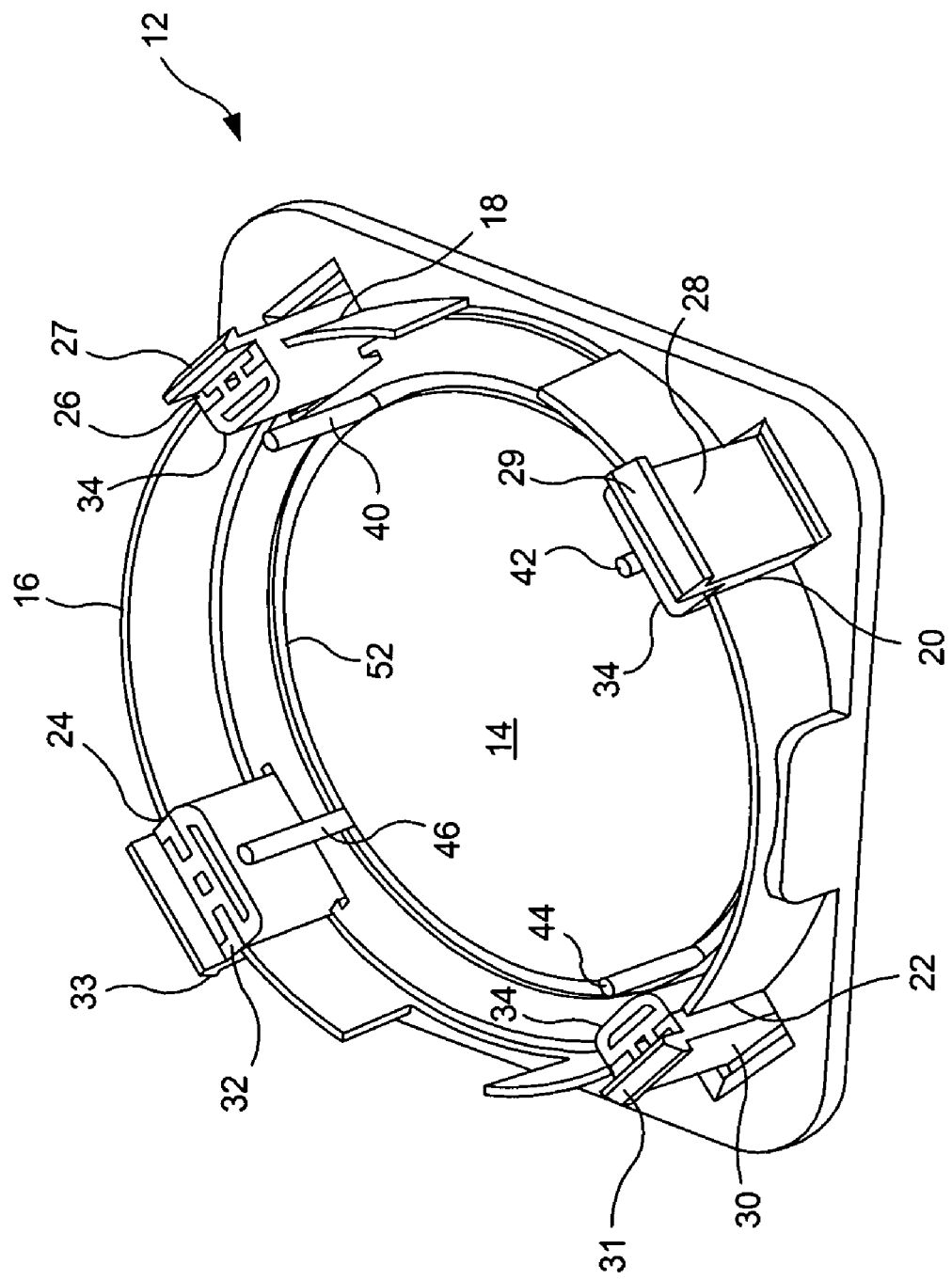
FIG. 5 is a top perspective view of the tray portion of the outer box of the wafer containment box of the present invention.

Referring now to the drawings in detail wherein like numerals refer to like elements throughout the several views, one sees that FIGS. 1-5 are various views of the lower tray 12 of the outer box of the wafer box 10 of the present invention.

Wafer box 10 is typically formed of plastic with electrostatic dissipative characteristics. Lower tray 12 includes planar floor 14 with segmented cylindrical wall 16 rising therefrom thereby forming containment space 16 therewithin. Segmented cylindrical wall 16 includes slots 18, 20, 22, 24 through which latch elements 26, 28, 30, 32 radially pivot. Furthermore, latch elements 26, 28, 30, 32 include respective detent heads 27, 29, 31, 33. Latch elements 26, 28, 30, 32 further each include padded bumper element 34 which is typically made of an extruded elastomeric or similar material for a shock absorbing effect. The structure of the radially pivoting latch elements 26, 28, 30, 32 and the bumper element 34 are described in more detail in U.S. patent application Ser. No. 10/507,471 entitled "Wafer Box with Radially Pivoting Latch Elements" filed on Sep. 10, 2004, the contents of which are incorporated by reference.

Male aligning elements 39 are formed on the exterior of cylindrical segmented wall 16.

Figure 11:
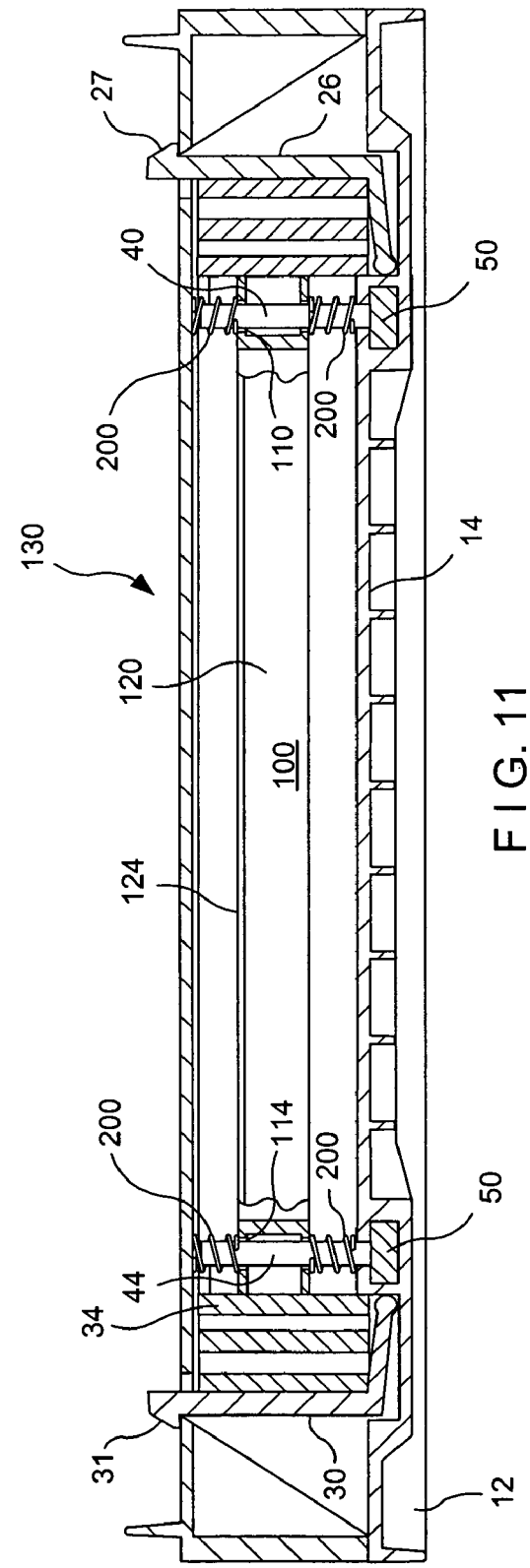
FIG. 11 is a cross-sectional view of the assembled wafer containment box of the present invention, filled with semiconductor wafers.

Support posts 40, 42, 44, 46 rise from planar floor 14 and, as shown in FIG. 11, are inserted through cylindrical sleeves 110, 112, 114, 116 of inner box 100. Furthermore, as shown in FIG. 11, support posts 40, 42, 44, 46 each have a lower enlarged foot 50. The lower enlarged feet 50 are keyed into circular track 52 in order to allow support posts 40, 42, 44, 46 to move through 360° around the center of lower tray 12. This allows free movement of the support posts 40, 42, 44, 46 and the inner box 100 in the lateral directions.

The upper lid 60 of the outer box of the wafer box 10 is illustrated in FIGS. 6-9. Lid 60 is generally square or rectangular in shape with slots 62, 64, 66, 68 at the four corners thereof for detent engaging the detent heads 27, 29, 31, 33 of latch elements 26, 28, 30, 32 when latch elements 26, 28, 30, 32 are pivoted to the upright position (as shown in FIG. 11). Finger gripping elements 72, 74, 76, 78 are formed on the upper surface of upper lid 60 inwardly adjacent of slots 62, 64, 66, 68. Additionally, as shown in FIG. 8 (and as shown in more detail in the above-identified U.S. patent application Ser. No. 10/507,471), ramps 82, 84, 86, 88 are formed on the underside of upper lid 60 immediately outwardly adjacent of slots 62, 64, 66, 68 to capture the detent heads 27, 29, 31, 33 to urge the latch elements 26, 28, 30, 32 to an upright position and to guide detent heads 27, 29, 31, 33 into slots 62 64, 66, 68.

Lid 60 further includes downwardly extending cylindrical skirt 90 which, in the installed position, fits concentrically outwardly adjacent from segmented cylindrical wall 16 of lower tray 12. Cylindrical skirt 90 further includes female aligning elements 92 in a slot configuration which engage male aligning elements 39 of lower tray 12 in the engaged configuration.

Figure 10:
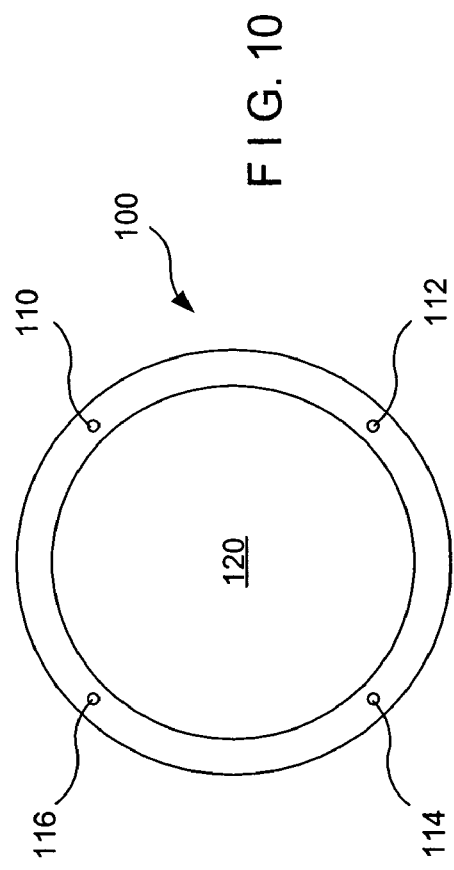
FIG. 10 is a top plan view of the inner box of the wafer containment box of the present invention, with the inner lid removed.

Inner box 100 is illustrated in FIG. 10. Inner box 100 has a circular outer shape so as to fit within segmented circular wall 16. Furthermore, inner box 100 includes cylindrical sleeves 110, 112, 114, 116 immediately inwardly adjacent of the outer periphery thereof which, as stated above, receive support posts 40, 42, 44, 46 which act as receiver guides. Typically, a minimum of four posts is used. Cylindrical wafer containment space 120 is formed immediately inwardly adjacent from cylindrical sleeves 110, 112, 114, 116. Alternatively, multiple wafer containment spaces or reservoirs may be formed in a single inner box 100. After cylindrical wafers have been inserted into cylindrical wafer containment space 120, lid 124 (shown in cross section in FIG. 11) is placed over inner box 100 so as to enclose the cylindrical semiconductor wafers. Lid 124 is typically cylindrical and co-extensive with the upper plane of inner box 100 and includes apertures aligning with sleeves 110, 112, 114, 116. Alternatively, lid 124 may be co-extensive with wafer containment space 120 and not require apertures. Lid 124 may include rims or similar structures to align and to seat with the inner box 100. Additionally, spacers (such as, but not limited to, those described in U.S. patent application Ser. No. 10/917,048, entitled "Foam Laminate System for Semiconductor Wafers" filed on Aug. 12, 2004) may be placed above and below the coin stack of wafers to provide extra protection and interleaves (such as, but not limited to, those described in U.S. patent application Ser. No. 10/919,640, entitled "Scribed Interleaf Separator Wafer Packaging", filed on Aug. 17, 2004) may be placed between the wafers for both mechanical and electrostatic protection.

Additionally, a plurality of inner boxes 100 may be coin stacked on support posts 40, 42, 44, 46. This is particularly advantageous when it is desired to ship wafers of different thicknesses and types in a single wafer box 10.

Shock absorbing rings 200, which may be made with a mechanical (such as a coil spring) or hydraulic design, or made from a foam or elastomer material, have cylindrical apertures thereby allowing the support posts 40, 42, 44, 46 to be inserted therethrough, thereby placing the shock absorbing rings 200 above and below the inner box 100 on each support post 40, 42, 44, 46, abutting the lower tray 12 and the upper lid 60, as shown in FIG. 11, in order to provide protection from vertical shocks. Shock absorber rings 200 may further include containment caps (not shown) which allow the shock absorber rings to be locked into position by a half twist slotted keyhole matching a corresponding structure in the support posts.

After the semiconductor wafers have been placed in the wafer containment space 120 of inner box 100 (along with any separators or interleaves), the lid 124 has been placed thereon, and the inner box 100 and shock absorbing rings 200 have been placed on the support posts 40, 42, 44, 46, then upper lid 60 can be placed over lower tray 12 so that latch elements 26, 28, 30, 32 are captured by ramps 82, 84, 86, 88 and urged to a upright position and detent engaged by slots 62, 64, 66, 68. This configuration further brings padded bumper elements 34 into contact with the walls of inner box 100, as shown in FIG. 11, thereby providing further protection from horizontal or lateral shocks.

Thus the several aforementioned objects and advantages are most effectively attained. Although preferred embodiments of the invention have been disclosed and described in detail herein, it should be understood that this invention is in no sense limited thereby and its scope is to be determined by that of the appended claims.

What is claimed is:

1. A containment device for semiconductor wafers, comprising:
   at least one inner box including a reservoir for holding semiconductor wafers;
   an outer box for containing said at least one inner box;
   said outer box including a base and a lid;
   said base and said at least one inner box including means for engaging each other; and
   said base including at least one cylindrical wall extending therefrom, said at least one cylindrical wall forming a space therewithin for receiving said at least one inner box, said at least one cylindrical wall including slots through which latch elements pivot radially.

2. The containment device for semiconductor wafers of claim 1 wherein said lid includes means for capturing said latch elements in an outwardly pivoted position and urging said latch elements to a radially inward position so as to engage said at least one inner box within said space, said latch elements thereby detent engaging said lid, said lid forming a top of the outer box when said base and said lid are detent engaged together.

3. The containment device for semiconductor wafers of claim 2 wherein said means for engaging said base and said at least one inner box includes at least one post rising from said base through said space and further includes at least one sleeve in said at least one inner box, whereby said at least one post is inserted through said at least one sleeve.

4. The containment device for semiconductor wafers of claim 3 further including shock absorbing rings which are placed on said at least one post.

5. The containment device for semiconductor wafers of claim 4 wherein said shock absorbing rings are placed on said at least one post above and below said at least one inner box.

6. The containment device for semiconductors of claim 3 wherein said base includes a circular track through which said at least one post can travel.

7. The containment device for semiconductors of claim 6 wherein said at least one post includes a lower enlarged head for engagement within said circular track and said at least one post can travel a full circle around said track.

8. The containment device for semiconductors of claim 2 wherein said latch elements include a padded bumper element for impinging against said at least one inner box and providing a shock absorbing function.

9. The containment device for semiconductors of claim 2 wherein said means for capturing said latch elements includes a ramp which leads to a slot for detent engaging said latch elements.

* * * * *